(12) United States Patent
Fukazawa

(10) Patent No.: US 6,858,274 B2
(45) Date of Patent: Feb. 22, 2005

(54) SYNTHETIC CORUNDUM CELL

(75) Inventor: Hajime Fukazawa, Sagamihara (JP)

(73) Assignee: Rion Co., Ltd., Tokyo (JP)

( * ) Notice: Subject to any disclaimer, the term of this patent is extended or adjusted under 35 U.S.C. 154(b) by 0 days.

(21) Appl. No.: 10/199,348

(22) Filed: Jul. 19, 2002

(65) Prior Publication Data
US 2002/0176075 A1 Nov. 28, 2002

Related U.S. Application Data

(63) Continuation-in-part of application No. 09/422,469, filed on Oct. 21, 1999, now Pat. No. 6,440,242.

(30) Foreign Application Priority Data

Dec. 22, 1998 (WO) ................... PCT/JP98/05802

(51) Int. Cl.[7] ............. B32B 17/00; B32B 1/02; G01N 21/05
(52) U.S. Cl. ............. 428/34.4; 428/34.1; 428/36.9; 428/426; 428/408; 356/135; 356/440
(58) Field of Search ............. 428/446, 408, 428/34.1, 34.4, 36.9, 426; 356/134, 135, 137, 442, 440, 441; 250/574, 576

(56) References Cited

U.S. PATENT DOCUMENTS

| | | | |
|---|---|---|---|
| 1,588,473 A | | 6/1926 | Kellcher |
| 5,201,977 A | | 4/1993 | Aoshima |
| 5,371,585 A | * | 12/1994 | Morgan et al. |
| 6,025,060 A | | 2/2000 | Meissner |
| 6,465,802 B1 | * | 10/2002 | Matsuda |

FOREIGN PATENT DOCUMENTS

| | | |
|---|---|---|
| JP | 2-124800 | 5/1990 |
| JP | 3-69600 | 3/1991 |
| JP | 3-115200 | 5/1991 |
| JP | 5-79640 | 3/1993 |
| JP | 7-145000 | 6/1995 |

* cited by examiner

Primary Examiner—Jennifer McNeil
(74) Attorney, Agent, or Firm—Merchant & Gould P.C.

(57) ABSTRACT

Ground joint surfaces of two synthetic corundum pieces 4, 5 are superposed on each other, and ends thereof are held in intimate contact with each other. The synthetic corundum pieces are then heated at a temperature equal to or lower than the melting point of synthetic corundum to joint the synthetic corundum pieces 4, 5.

2 Claims, 9 Drawing Sheets

FIG. 1
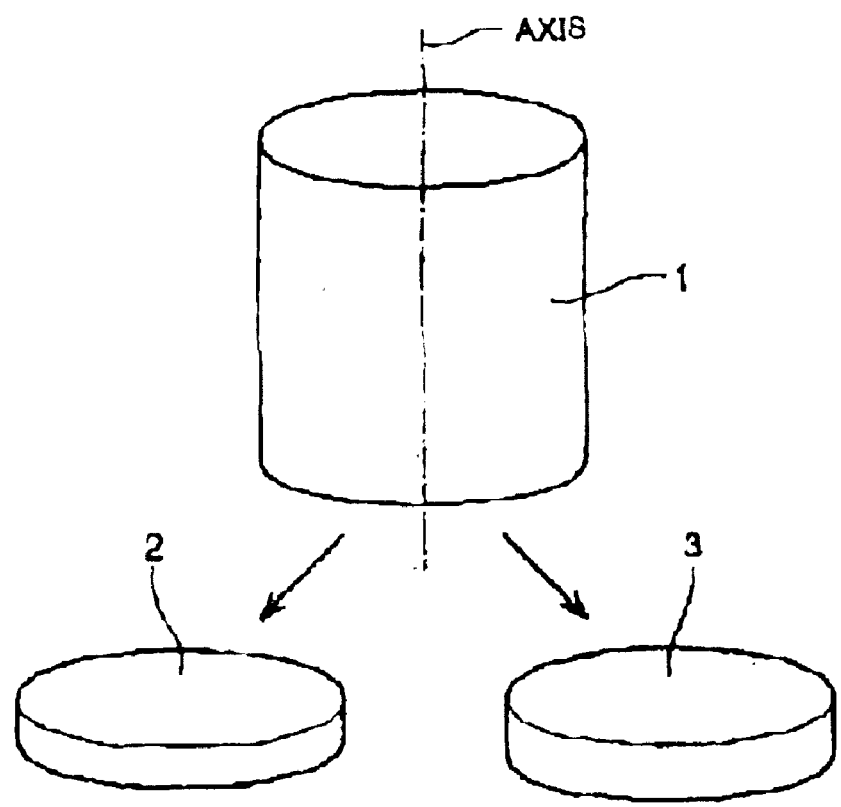
FIG. 2(a)　　　　　FIG. 2(b)
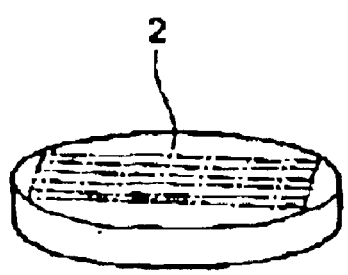 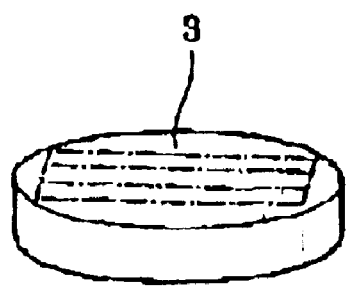
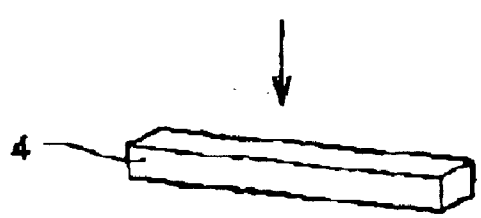 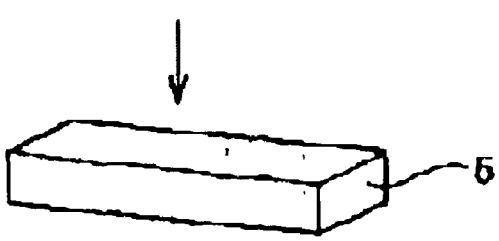

Amount of axis displacement in each plane

|  | a-plane | | m-plane | |
|---|---|---|---|---|
|  | (1) | (2) | (3) | (4) |
| Sample 1 | 0.4 | 0.85 | 3.1 | 2.5 |
| Sample 2 | 0.0 | 0.3 | 2.8 | 4.0 |
| Sample 3 | 0.4 | 0.3 | 6.8 | 4.0 |

SYNTHETIC CORUNDUM CELL

This application claims the benefit of U.S. application Ser. No. 09/422,469, filed Oct. 21, 1999 and entitled METHOD OF JOINTING SYNTHETIC CORUNDUM, METHOD OF MANUFACTURING SYNTHETIC CORUNDUM CELL, AND SYNTHETIC CORUNDUM CELL, now issued as U.S. Pat. No. 6,440,242, which is in its entirety incorporated herewith by reference.

TECHNICAL FIELD

The present invention relates to a synthetic corundum cell.

BACKGROUND ART

Hexagonal synthetic corundum (synthetic sapphire) is excellent in terms of hardness, light transmission, and resistance to chemicals, and hence is used in a flow cell, for example, which is incorporated in a particle counter which count particles contained in a liquid such as hydrofluoric acid, for example.

Manufacturing products of synthetic corundum needs to join synthetic corundum pieces that have been cut to predetermined dimensions. However, since single crystals such as synthetic corundum pieces have different coefficients of thermal expansion dependent on the direction in the crystals, synthetic corundum pieces that have simply been joined together would tend to peel off, and are not suitable for use in flow cells through which the hydrofluoric acid or the like passes.

There has been known a method of manufacturing a structural body made of a single crystal of integral synthetic corundum as disclosed in Japanese patent publication No. 5-79640. According to the disclosed method, an ingot of a single crystal of synthetic corundum is cut into a first prism, and a surface of the first prism is optically ground to a flatness accuracy that is equal to or less than $\lambda/8$ of the wavelength $\lambda(=6328 \text{ Å})$ of red light, thus producing a second prism. Four surfaces, including the optically ground surface, of the second prism are surrounded by a jig, and cut into a first planar piece with a plane perpendicular to the optically ground surface. Then, both upper and lower surfaces of the first planar piece are optically ground to produce a second planar piece, which is cut into cut planar pieces. The cut planar pieces are separated and superposed by an assembling jig such that their upper pieces are separated and superposed by an assembling jig such that their upper and lower optically ground surfaces are aligned with each other for aligned crystalline planes, ridges, axes, and axial angles. A small pressure is applied to the planar pieces to completely eliminate any interference fringes on their transparent boundary surfaces to chemically pressurize and join the planar pieces into intimate contact with each other. The planar pieces are then heated at a temperature of 1200° C. which is lower than the melting point of 2030° C. of synthetic corundum, so that they are joined into close contact with each other.

The flatness is defined as follows: When a planar body (P) is sandwiched by two geometrically parallel planes, the flatness is expressed by the distance (f) between the two parallel planes which is minimum, and represented by a flatness X mm or X μm (X is a numerical value). Therefore, the flatness accuracy that is equal to or less than $\lambda/8$ means the flatness of at most 0.0791 μm.

According to the above method of manufacturing a structural body made of a single crystal of integral synthetic corundum, a reference surface is formed on the first prism by being optically ground to a flatness accuracy that is equal to or less than $\lambda/8$ of the wavelength $\lambda$ (=6328 Å) of red light, i.e., a flatness of at most 0.0791 μm. Then, a planar piece having the reference surface is cut from the first prism, and further cut into a plurality of planar pieces, which are combined together with respect to their reference surfaces so as to be superposed for aligned crystalline planes, ridges, axes, and axial angles. When a small pressure is applied to the planar pieces to completely eliminate any interference fringes on their transparent boundary surfaces, the planar pieces are chemically pressurized and joined in intimate contact with each other, not just held in intimate contact with each other. The planar pieces are then heated at a temperature of 1200° C. which is lower than the melting point of 2030° C. of synthetic corundum, so that they are joined into a structural body made of a single crystal of integral synthetic corundum where no boundary surfaces are present between the planar pieces and the planar pieces will not peel off.

In order to produce a synthetic corundum cell according to the above method, it is usually necessary to cut a cylindrical ingot into a prism, grind a surface of the prism to a highly small flatness of 0.0791 μm, grind planar pieces cut from the prism to a highly small flatness of 0.0791 μm, and manage a particular temperature of 1200° C. Consequently, the production process is complex, inefficient as it requires very high grinding process, and needs difficult process control. The production process is not practical, and the cost of synthetic corundum cells manufactured by the method is extremely high.

The inventor has made research efforts to develop a practical technology for joining synthetic corundum through a simple process even with a certain large value of flatness, unlike the above conventional unpractical technique. The inventor attempted to superpose synthetic corundum pieces whose ground surfaces are fully held in optical contact and heat them while adjusting the heating temperature. However, this method not only produced boundaries at the joined surfaces, but also formed smears in the boundaries, resulting in a failure to meet optical requirements. After repeating trial-and-error efforts, the inventor found that a structural body which has boundaries, but contains highly reduced smears and meet optical requirements, and are practical in terms of mechanical strength, though not firm enough to be integral, can be produced by keeping only ends of joined surfaces of synthetic corundum pieces in optical contact with each other and heating them, rather than the conventional common technical approach to superpose two optical members whose entire joint surfaces are held in optical contact with each other.

The present invention has been made in view of the problems of the conventional method of manufacturing a structural body made of a single crystal of integral synthetic corundum. It is an object of the present invention to provide a synthetic corundum cell having desired optical characteristics and mechanical strength which is produced efficiently in a simple manufacturing process.

DISCLOSURE OF THE INVENTION

To solve the above problems and achieve the above object, according to the present invention, there is provided a synthetic corundum cell comprising a pair of prism-like light transmission plates made of synthetic corundum and a pair of prism-like spacer plates made of synthetic corundum, each of the prism-like spacer plate being positioned between the prism-like light transmission plates, wherein the prism-like light transmission plates and the prism-like spacer plates are joined by being heated to form a flow path for fluid in the central portion thereof, and wherein the prism-like light transmission plates and the prism-like spacer plates are joined for aligned crystalline planes and at least two of the prism-like light transmission plates and the prism-like spacer plates have a different X-ray diffraction angle with respect to each other in a plane parallel to the flow path.

In a flow cell or the like, since light is never incident upon nor radiated from the front and back end surfaces thereof, smoothness is not essential for the front and back surfaces as for the other surfaces. Consequently, when the synthetic corundum cell is used as a flow cell or the like, the o-plane, which is hard to grind, is preferably used as the front and back end surfaces of a flow cell, while the a-plane and the m-plane are used as the joint surface.

The flatness of the joint surfaces should preferably be in the range from ½ to ⅙ of the wavelength $\lambda(=6328$ Å) of red light, i.e., in the range from 0.3164 μm to 0.10546 μm. If the flatness of the joint surfaces were greater than $\lambda/2$ (flatness>$\lambda/2$), then no sufficient joined state may not be obtained. Demanding a flatness smaller than $\lambda/6$ (flatness<$\lambda/6$) would result in an increase in the cost and would not be practical. The temperature at which to heat the synthetic corundum pieces should preferably be in the range from 1100° C. to 1800° C. If the temperature were lower than 1100° C., then no sufficient joining strength may be obtained. If the temperature were in excess of 1800° C., then an apparatus for heating the synthetic ∞-rundum pieces would be large in size. A particularly preferable temperature range is from 1300° C. to 1500° C.

An example of a method of manufacturing the synthetic corundum cell is characterized by the steps of superposing ground joint surfaces of second and third synthetic corundum pieces on a ground joint surface of a first synthetic corundum piece, positioning the second and third synthetic corundum pieces in confronting relationship to each other with a predetermined spacing therebetween, holding ends of the joint surface of the first synthetic corundum piece and the joint surfaces of the second and third synthetic corundum pieces in intimate contact with each other, thereafter heating the synthetic corundum pieces at a temperature equal to or lower than the melting point of synthetic corundum to join the joint surface of the first synthetic corundum piece and the joint surfaces of the second and third synthetic corundum pieces to each other, producing a stacked assembly, superposing a ground joint surface of a fourth synthetic corundum piece on other ground joint surfaces of the second and third synthetic corundum pieces of the stacked assembly, holding ends of the other joint surfaces of the second and third synthetic corundum piece and the joint surface of the fourth synthetic corundum piece in intimate contact with each other, thereafter heating the synthetic corundum pieces at a temperature equal to or lower than the melting point of synthetic corundum to join the other joint surfaces of the second and third synthetic corundum pieces and the joint surface of the fourth synthetic corundum piece of the stacked assembly to each other, producing a synthetic corundum cell.

In the above method, the flatness of, and the temperature at which to heat, the synthetic corundum pieces are preferably the same as the flatness of, and the temperature at which to heat, the above synthetic corundum pieces.

In the specification, the term "intimate contact" represents a state in which two surfaces which are strictly analogous to each other are held in intimate contact (referred to as "optical contact") with each other without the use of an adhesive, and the term "joining" represents holding the surfaces in a stronger intimate contact state (with higher peeling strength) than the optical contact state.

BRIEF DESCRIPTION OF THE DRAWINGS

FIG. 1 is a view illustrative of the manner in which a spacer plate disk and a light transmission plate disk are cut from an ingot of synthetic corundum;

FIG. 2(a) is a view illustrative of the manner in which a spacer plate is cut from the spacer plate disk, and FIG. 2(b) is a view illustrative of the manner in which a light transmission plate is cut from the light transmission plate disk;

BEST MODE FOR CARRYING OUT THE INVENTION

Figure 3A:
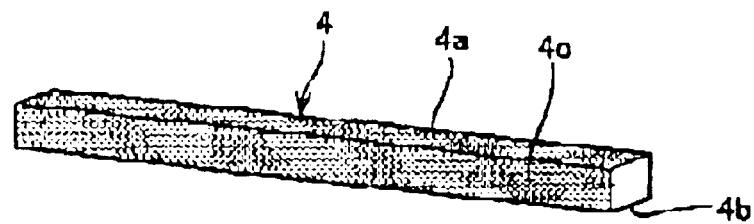
FIG. 3(a) is a view illustrative of the manner in which the spacer plate is ground.

An embodiment of the present invention will be described below with reference to the accompanying drawings. In the embodiment, a method of manufacturing a flow cell which is a synthetic corundum cell according to the present invention will be described below.

As shown in FIG. 1, a cylindrical crystalline block (ingot) 1 of synthetic corundum is cut in a direction perpendicular to the axis thereof (c-axis in the illustrated embodiment) to produce a spacer plate disk 2 from which one or more spacer plates for use as a second or third synthetic corundum piece will be cut, and a light transmission plate disk 3 from which one or more light transmission plates for use as a first or fourth synthetic corundum piece will be cut.

While the disk 2 is shown as being thinner than the disk 3 in FIG. 1, the thicknesses of the these disks 2, 3 may depend on the dimensions of a synthetic corundum cell to be manufactured, and are not limited to those illustrated.

Then, as shown in FIG. 2(a), a plurality of spacer plates 4 each for use as the second or third synthetic corundum piece are cut from the spacer plate disk 2. As shown in FIG. 2(b), a plurality of light transmission plates 5 each for use as the first or fourth synthetic corundum piece are cut from the light transmission plate disk 3. The second and third synthetic corundum pieces comprise the spacer plates 4 of the same dimensions, and the first and fourth synthetic corundum pieces comprise the light transmission plates 5 of the same dimensions. However, they may comprise plates of different dimensions.

Thereafter, as shown in FIG. 3(a), upper and lower surfaces of the spacer plate 4, which will serve as joint surfaces, and a side surface thereof, which will serve as a wall surface defining a through hole of a flow cell, are ground into ground surfaces 4a, 4b, 4c, respectively, to a flatness of about ¼ of the wavelength λ (=6328 Å) of red light, i.e., a flatness of about 0.1582 μm.

The flatness of the ground surfaces 4a, 4b is not limited to ¼ of the wavelength λ, but should preferably be in the range from ½ to ⅙ of λ, i.e., in the range from 0.3164 μm to 0.10546 μm. If the flatness of the ground surfaces 4a, 4b were greater than λ/2 (flatness>λ/2), then it would be tedious and time-consuming or impossible to mate the ground surfaces 4a, 4b with a joint surface of the light transmission plate 5 and hold their one ends in intimate contact with each other. It would be time-consuming, inefficient, and costly to grind the surfaces 4a, 4b to a flatness smaller than λ/6 (flatness<λ/6).

Although the upper and lower surfaces of the spacer plate 4 are ground into the ground surfaces 4a, 4b, the upper and lower surfaces may not necessarily be ground at this stage because an unjoined surface of the spacer plate 4 will subsequently be ground to adjust the thickness of the spacer plate 4 after the spacer plate 4 is joined to the light transmission plate 5. However, with the upper and lower surfaces of the spacer plate 4 being ground, either of the ground surfaces 4a, 4b can be superposed as a joint surface on a joint surface of the light transmission plate 5, resulting in increased working efficiency, and either of the ground surfaces 4a, 4b which better matches a joint surface of the light transmission plate 5 can selectively be used, resulting in increased joining accuracy and strength. Since the ground surface 4c will serve as a wall surface defining a through hole, the flatness of the ground surface 4c may be of such a degree as required when the final product will be used as a flow cell.

Figure 3B:
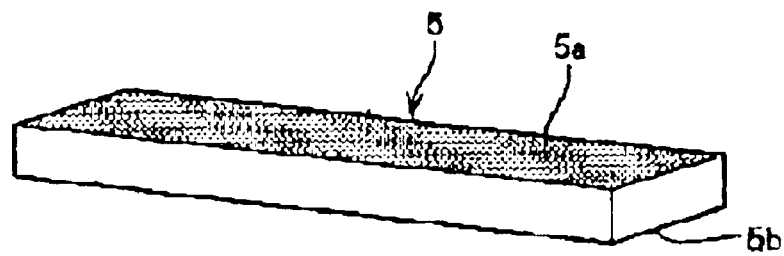
FIG. 3(b) is a view illustrative of the manner in which the light transmission plate is ground.

As shown in FIG. 3(b), upper surfaces of the light transmission plate 5, which will serve as joint surfaces, are ground into ground surfaces 5a, 5b, respectively, to a flatness of about ¼ of the wavelength λ (=6328 Å) of red light.

While the flatness of the ground surfaces 5a, 5b is not limited to ¼ of wavelength λ of red light, it should preferably be in the range from ½ to ⅙ of λ, i.e., in the range from 0.3164 μm to 0.10546 μm. If the flatness of the ground surfaces 5a, 5b were greater than λ/2 (flatness>λ/2), then it would be tedious and time-consuming or impossible to mate the ground surfaces 4a, 4b of the spacer plate 4 with one of the ground surfaces 5a, 5b of the light transmission plate 5 and hold their one ends in intimate contact with each other. It would be time-consuming, inefficient, and costly to grind the surfaces 5a, 5b to a flatness smaller than λ/6 (flatness<λ/6).

Although the upper and lower surfaces of the light transmission plate 5 are ground into the ground surfaces 5a, 5b, since only one surface thereof will be joined to the spacer 4, such a surface may be designated as a joint surface, and only the joint surface may be ground, and hence both upper and lower surfaces may not necessarily be ground. If one surface is designated as a joint surface, then the flatness of a surface that is not the joint surface may be ground to such a degree as required when the final product will be used as a flow cell. However, with the upper and lower surfaces of the light transmission plate 5 being ground to the same degree, either of the ground surfaces 5a, 5b can be superposed as a joint surface on a joint surface of the spacer plate 4, resulting in increased working efficiency, and either of the ground surfaces 5a, 6b which better matches a joint surface of the spacer plate 4 can selectively be used, resulting in increased joining accuracy and strength.

A plurality of spacer plates 4 and a plurality of light transmission plates 5 may be produced in advance, and two spacer plates 4 and two light transmission plates 5 may be selected therefrom and used for increased working efficiency. Of course, two spacer plates 4 and two light transmission plates 5 may be specified and used from the grinding process on. The spacer plates 4 and the light transmission plates 5 are dimensioned such that when unground side surfaces of the spacer plates 4 are aligned with side surfaces of the light transmission plates 5, the spacer plates 4 will be spaced a predetermined distance from each other. This dimensional setting increases the working efficiency of the joining process.

Figure 4A:
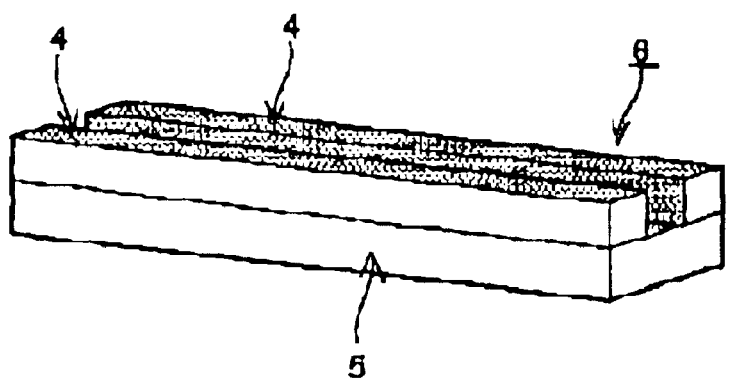
FIG. 4(a) is a perspective view of a stacked assembly comprising spacer plates set on a light transmission plate.
Figure 4B:
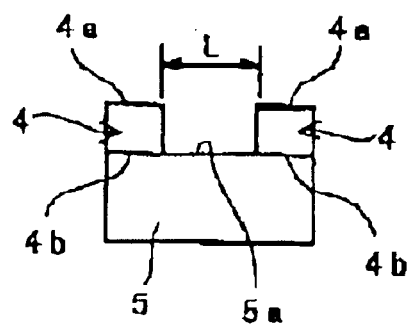
FIG. 4(b) is a side elevational view of the stacked assembly.

As shown in FIGS. 4(a) and 4(b), either of the ground surfaces 5a, 5b of an arbitrarily selected light transmission plate 5 is used as a joint surface (here, the ground surface 5a is used as a joint surface), and either of the ground surfaces 4a,4b of each of two arbitrarily selected spacer plates 4 is used as a joint surface (here, the ground surface 4b is used as a joint surface). The light transmission plate 5 and the spacer plates 4 are superposed into a stacked assembly 6.

As described above, the spacer plates 4 and the light transmission plate 5 are dimensioned such that when unground side surfaces of the spacer plates 4 are aligned with side surfaces of the light transmission plate 5, the spacer plates 4 will be spaced a predetermined distance L from each other for increased working efficiency.

Figure 5:
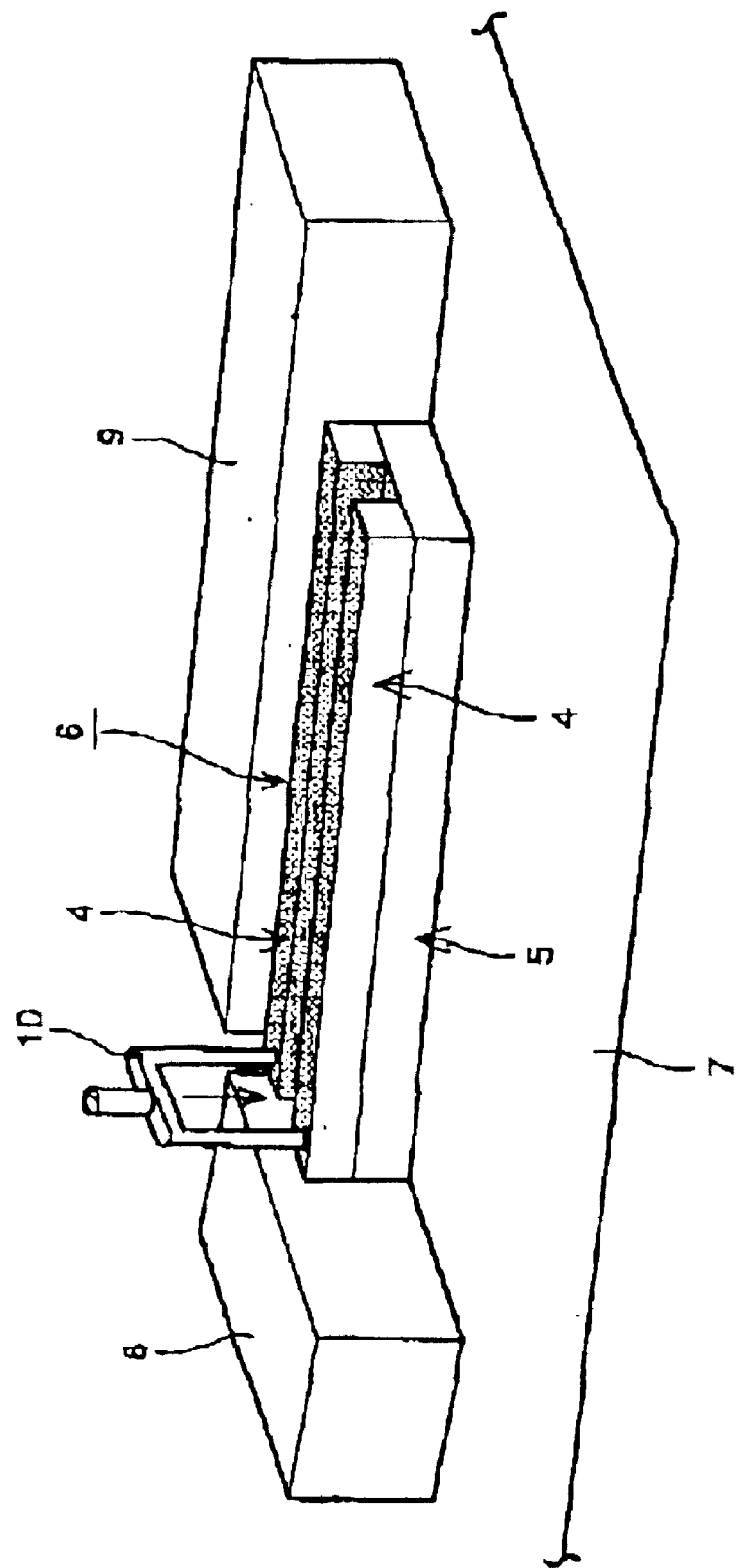
FIG. 5 is a perspective view showing the manner in which one end of the stacked assembly comprising the spacer plates set on the light transmission plate is pressed on a jig base.
Figure 6:
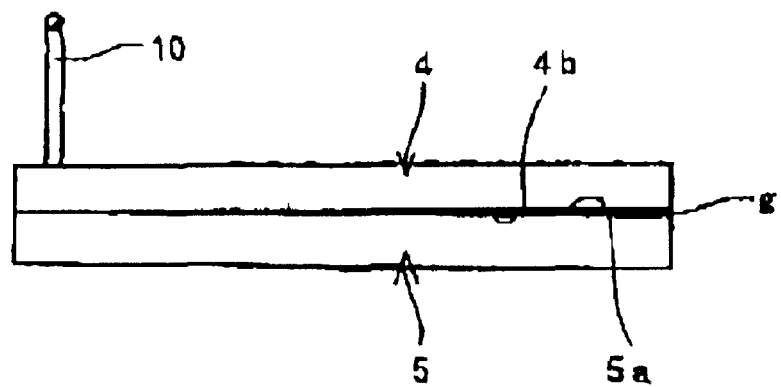
FIG. 6 is a view showing, in an exaggerated fashion, the other end of the stacked assembly whose one end is pressed.

The single light transmission plate 5 and the two spacer plates 4 are superposed as follows: As shown in FIG. 5, end and side surfaces of the light transmission plate 5 are aligned with respective positioning blocks 8, 9 perpendicular to each other which are placed on a jig base 7, and an end surface and an unground side surface of one spacer plate 4 are held in abutment against the respective positioning blocks 8, 9 and placed on the light transmission plate 5. Then, opposite end and side surfaces of the light transmission plate 5 are aligned with the respective positioning blocks 8, 9, and an end surface and an unground side surface of the other spacer plate 4 are held in abutment against the respective positioning blocks 8, 9 and placed on the light transmission plate 5. Ends of the spacer plates 4 are pressed by a pressing jig 10. As shown in the side elevational view of FIG. 6, since lower surfaces of ends of the ground surfaces 4b as the joint surfaces of the spacer plates 4 and an upper surface of an end of the ground surface 5a as the joint surface of the light transmission plate 5 have been ground, they are held in intimate contact with each other, i.e., in optical contact with each other. A slight gap g is created between the remaining lower surfaces of the ground surfaces 4b of the spacer plates 4 and the remaining upper surface of the ground surface 5a of the light transmission plate 5. While the gap g is shown as being exaggerated for an easier understanding, it practically is difficult to visually recognize the gap g.

Figure 7:
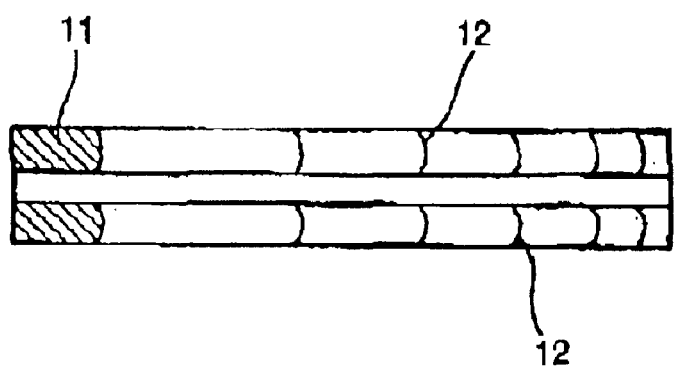
FIG. 7 is a plan view of the stacked assembly whose one end is pressed.

FIG. 7 is a plan view of the stacked assembly 6. In FIG. 7, in a region which is pressed by the pressing jig 10, the lower surfaces of the ends of the spacer plates 4 and the upper surface of the end of the light transmission plate 5 are held in an optical contact state 11, and interference fringes 12 are formed in the other region due to an air layer present between the lower surfaces of the spacer plates 4 and the upper surface of the light transmission plate 5. The interference fringes 12 appear as they are more closely spaced progressively from one end toward the other of the stacked assembly 6.

When the spacer plates 4 and the light transmission plate 5 are locally held in optical contact with each other, they are physically attracted to each other in the optical contact region, allowing the stacked assembly 6 to keep its configuration.

The stacked assembly 6 is then placed into a furnace and heated at a temperature lower than the melting point of 2030° C. of synthetic corundum, e.g., 1300° C. The ground surfaces (joint surfaces) of the spacers 4 and the ground surface (joint surface) of the light transmission plate 5 are joined to each other.

Figure 8:
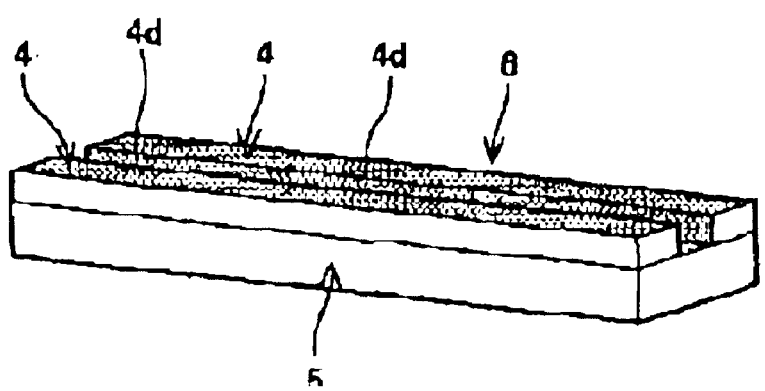
FIG. 8 is a view of the stacked assembly which has been heated, with upper surfaces of the spacer plates being ground.
Figure 9:
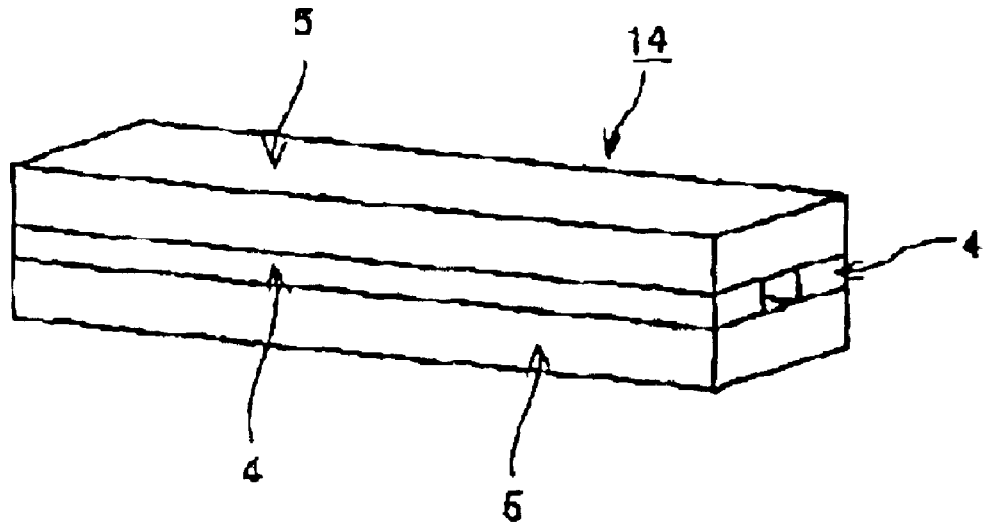
FIG. 9 is a view of an assembly comprising the stacked assembly shown in FIG. 8 and a light transmission plate superposed on the spacer plates of the stacked assembly.

Thereafter, the stacked assembly 6 is removed from the furnace, and the ground surfaces 4a of the spacer plates 4 which are not joined are ground into ground surfaces 4d, as shown in FIG. 8, for thereby adjusting the thicknesses of the spacer plates 4. The flatness of the ground surfaces 4d is the same as the flatness of the ground surfaces 4a, 4b.

After the thickness adjustment is finished, a ground surface, i.e., a ground surface 5b in the illustrated embodiment, of another light transmission plate 5 is placed on the ground surfaces 4d of the spacer plates 4, making up a stacked assembly 14. Subsequently, an end of the light transmission plate 5 is pressed by a pressing jig 10, holding ends of the ground surfaces 4d as joint surfaces of the spacer plates 4 and an end of the ground surface 5b as a joint surface of the newly placed light transmission plate 5 in optical contact with each other, with interference fringes produced in the remaining region.

Thereafter, the stacked assembly 14 is placed into the furnace and heated, thus joining the other light transmission plate 5 to the upper surfaces of the spacer plates 4.

In this manner, there is produced a corundum cell 16 comprising two spacer plates 4 sandwiched between two light transmission plates 5 with a through hole 15 defined therebetween.

The spacer plates 4 and the light transmission plates 5 are not integrally united because of boundaries present between the spacer plates 4 and the light transmission plates 5. However, any smears on boundaries are highly reduced in the region where the joint surfaces of the spacer plates 4 and the joint surfaces of the light transmission plates 5 are not held in optical contact with each other before they are heated. Smears are produced on boundaries in the region where the joint surfaces of the spacer plates 4 and the joint surfaces of the light transmission plates 5 are held in optical contact with each other before they are heated.

It is presumed that smears on the boundaries in the region where the joint surfaces are not held in optical contact with each other are reduced because a solvent used to remove water remaining on the ground surfaces (joint surfaces) of the spacer plates 4 and the ground surfaces (joint surfaces) of the light transmission plates 5 and clean the joint surfaces is scattered away when being heated. It is presumed that smears are produced on boundaries in the region where the joint surfaces are held in optical contact with each other because a solvent used to remove water remaining on the ground surfaces (joint surfaces) of the spacer plates 4 and the ground surfaces (joint surfaces) of the light transmission plates 5 and clean the joint surfaces cannot not be scattered away from the optical contact region when being heated.

Therefore, the end of the corundum cell where smears are produced on the boundaries is removed in a subsequent process, and only a portion of the ∞-rundum cell where smears are few is used for thereby producing a corundum cell which has desired optical characteristics and sufficient mechanical strength. Inasmuch as the synthetic corundum pieces are not integrally united, they tend to peel off from the boundaries when subjected to large forces. However, the corundum cell has practically sufficient mechanical strength.

Unlike the conventional process in which a plurality of planar pieces are cut from a single piece having a surface ground to a flatness of λ/8 as a reference surface, stacked with respect to the reference surface for aligned crystalline planes, ridges, axes, and axial angles, and then heated, the synthetic corundum pieces can be joined even if crystalline axes, ridges, and axial angles are somewhat displaced out of alignment according to the present invention.

In an experiment, even if the axes were displaced by about 20°, the synthetic corundum pieces could be firmly joined with substantially no optical smears. In view of the final product and the ease of the manufacturing process, it is preferable to produce the spacer plates 4 and the light transmission plates 5 such that any displacement between the crystalline axes of the synthetic corundum pieces are kept within 5°.

Figure 10A:
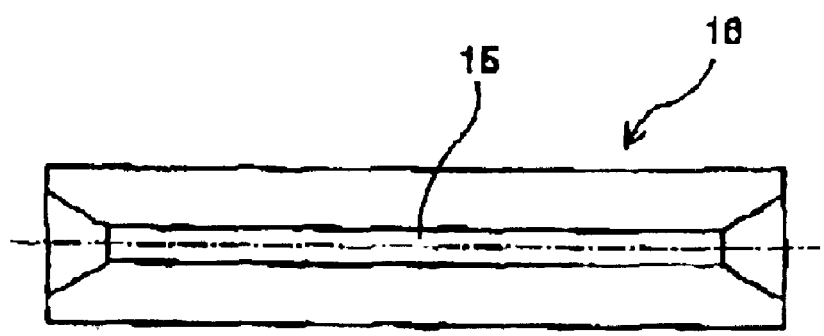
FIG. 10(a) is a plan view of a flow cell comprising a synthetic corundum cell manufactured by a method according to the present invention.
Figure 10B:
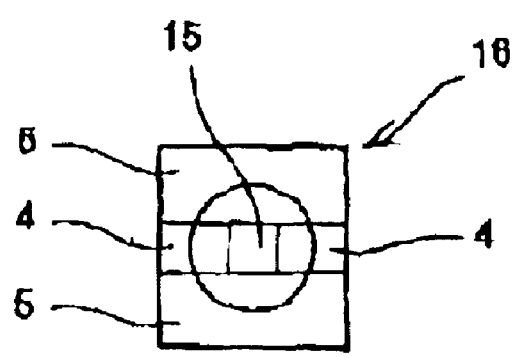
FIG. 10(b) is a side elevational view of the flow cell.

After the end of the corundum cell where smears are produced is removed and the corundum cell is finished to predetermined dimensions, the opposite end surfaces of the corundum cell are tapered to produce a flow cell 16 of synthetic corundum as shown in FIGS. 10(a) and 10(b).

In the above embodiment, the lower surfaces of the spacer plates 4 and the upper surface of the lower light transmission plate 5, and the upper surfaces of the spacer plates 4 and the lower surface of the upper light transmission plate 5 are heated and joined in separate processes. However, they may be heated and joined simultaneously.

According to the conventional method, by joining corundum pieces for aligned crystalline planes, ridges, axes, and axial angles chemically pressurized and joined in an intimate contact state, in which no joint surface can be recognized, may be obtained. However, the conventional method is unpractical as mentioned above.

Figure 11:
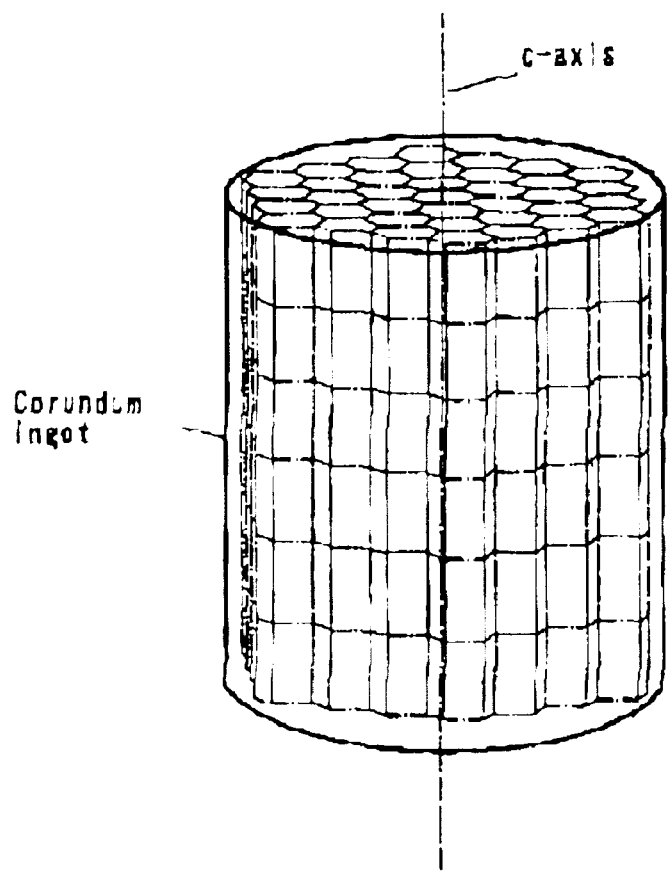
FIG. 11 is a perspective view showing a bulk single-crystal body (ingot) of corundum.

In the present invention, even if the axes (c-axis) of the synthetic corundum pieces to be joined were displaced by about 20°, the synthetic co-rundumcell could have substantially no optical problems. In this regard, the reason why the axes (c-axis) are displaced is as follows:

As shown in FIG. 11, a bulk single-crystal body (ingot) is obtained by growing a hexagonal single-crystal in the direction of the c-axis. As a common method for obtaining a bulk single-crystal body, a CZ method and a Verneuil method are known.

Figure 12:
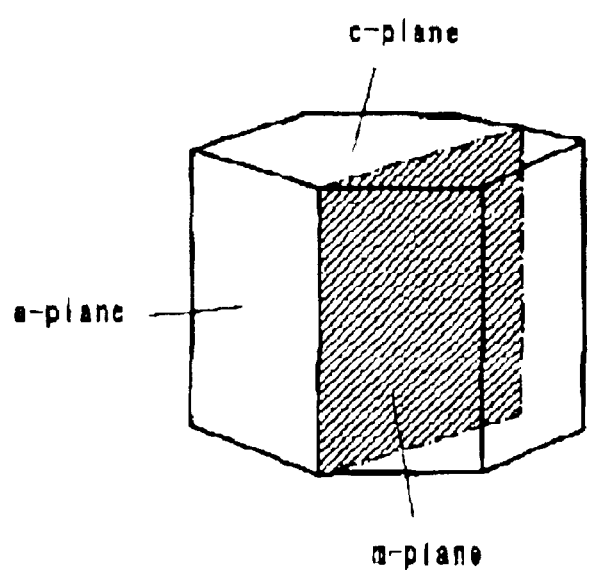
FIG. 12 is a view showing crystalline planes of corundum.

As shown in FIG. 12, a unit crystal which constitutes a bulk single-crystal body has its c-plane perpendicular to the direction of the c-axis and its a-plane parallel to the direction of the c-axis. An actual corundum crystal has an n-plane and an r-plane which are present between the c-plane and the a-plane as an inclined plane. However, in the specification, the n-plane and the r-plane are omitted for an easier understanding. There is also an m-plane perpendicular to both the c-plane and the a-plane, which is formed in a subsequent cutting process.

Figure 13:
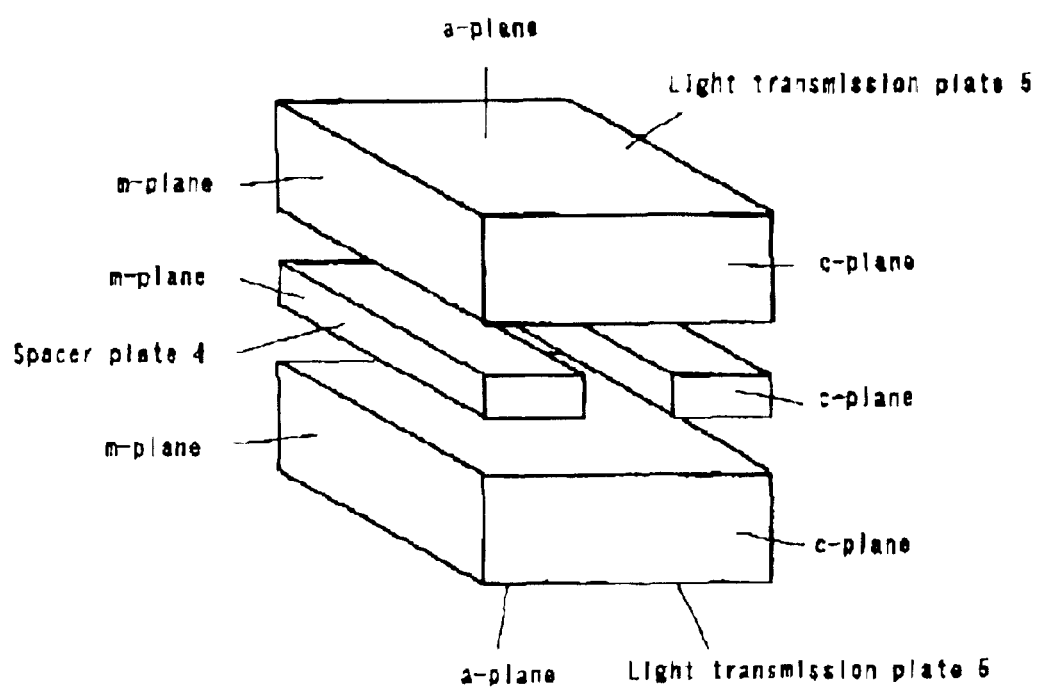
FIG. 13 is an exploded view showing the relationship between each surface of the synthetic corundum cell and the crystalline planes.

As shown in FIG. 13, in the present embodiment, the a-plane of prism-like light transmission plates 5 and the a-plane of prism-like spacer plates 4 are joined, while m-plane of the prism-like light transmission plates 5 and the m-plane of the prism-like spacer plates 4 are not joined. Also, the c-plane, which is hard to grind, is used as the front and back end surfaces where a flow path opens.

Figure 14:
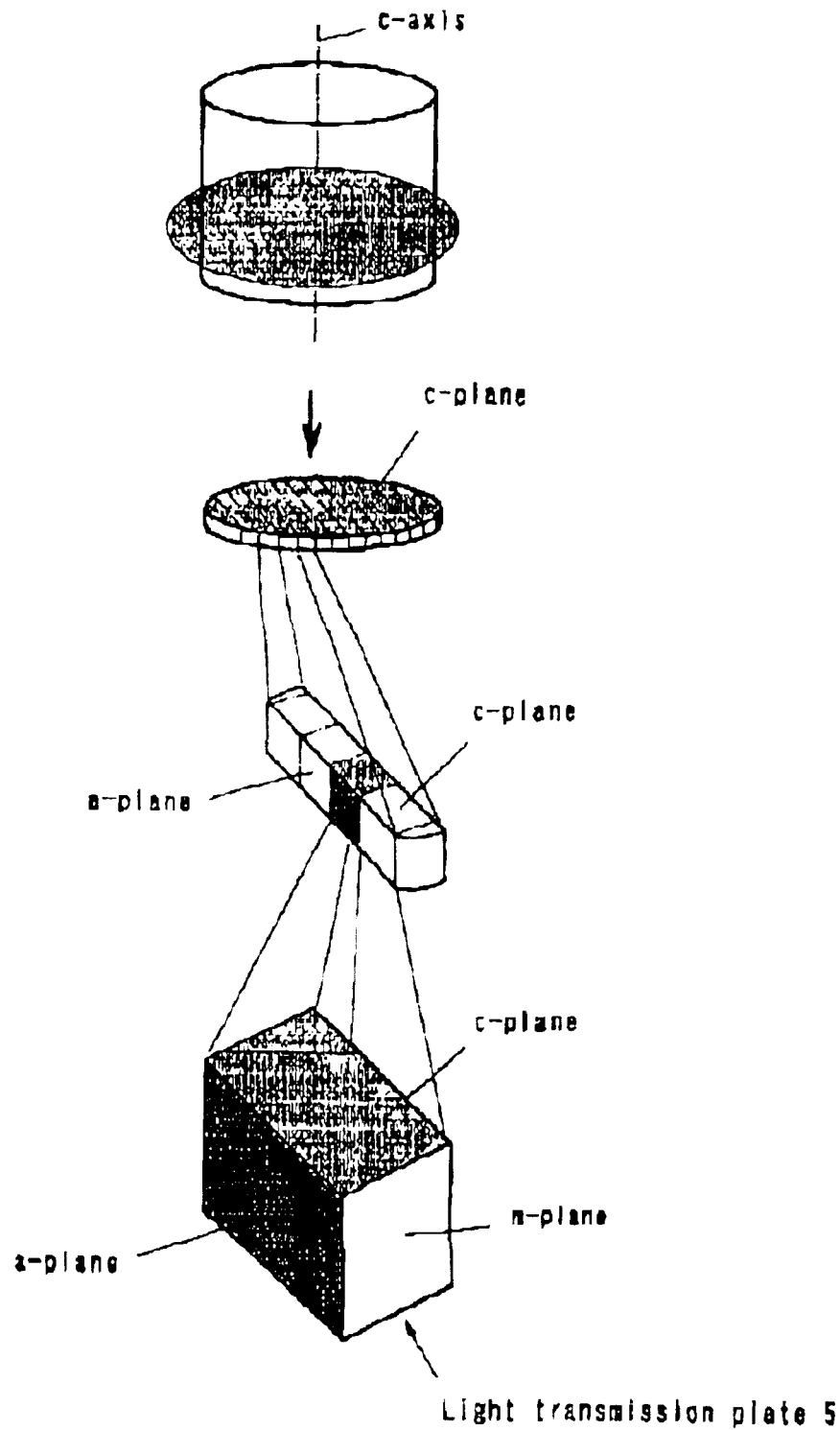
FIG. 14 is a view illustrative of the manner in which a corundum piece (light transmission plate) is cut from a bulk single-crystal body.

A process for obtaining the prism-like light transmission plate 5 from a bulk single-crystal body (ingot) 1 will be described below with reference to FIG. 14. First, the bulk single-crystal body (ingot) 1 is cut in the direction perpendicular to the c-axis. The cut disk body is further cut along the a-plane and thereby a rod body is obtained. Finally, the prism-like light transmission plate 5 is obtained by cutting the rod body along the m-plane. Alternatively, the cut disk body may be cut along the m-plane to obtain a rod body, and the rod body may be cut along the a-plane to obtain the prism-like light transmission plate 5.

Also, the prism-like spacer plate 4 is obtained in the same manner as the prism-like light transmission plate 5.

Figure 15:
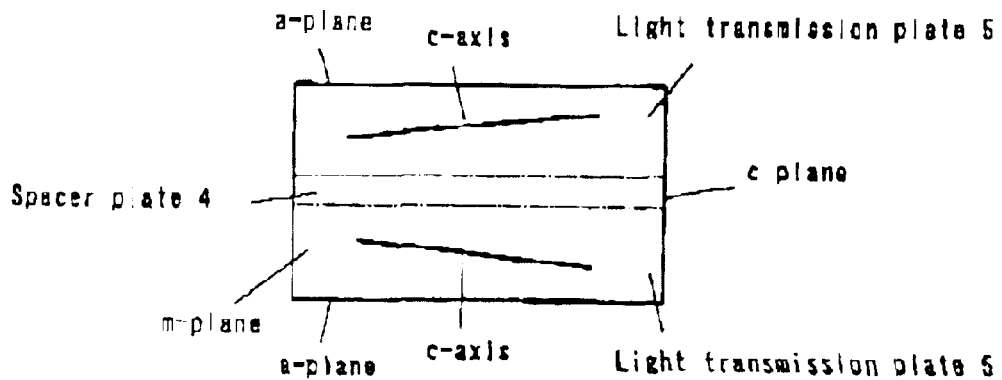
FIG. 15 is a side view showing the direction of the c-axis of a corundum cell according to the present invention.

In a case of a flow cell, since the c-plane is used as the front and back end surfaces, it is manufactured such that the axis of the through hole 15 which will serve as a flow path is parallel to the c-axis by as much as possible. However, it is necessary to conduct cutting at least three times in order to obtain the prism-like light transmission plate 5 (and the prism-like spacer plate 4) from the bulk single-crystal body (ingot) 1 as mentioned above. An error in cutting inevitably occurs in each cutting, and such an error is accumulated. Consequently, in the process shown in FIG. 14, the error is greater with respect to the a-plane than the c-plane, and greater with respect to the m-plane than the a-plane. Also, since, in the present invention, crystalline ridges, axes, and axial angles are not aligned when the prism-like light transmission plate 5 and the prism-like spacer plate 4 are joined, the c-axes of the pair of the prism-like light transmission plates 5 are not parallel, for example, as shown in FIG. 15.

Figure 16:
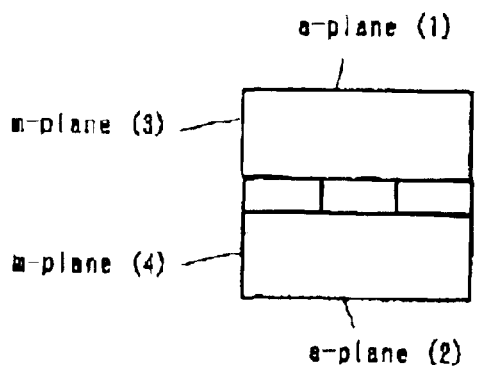
FIG. 16 is a table showing the amount of axis displacement in each plane.

The measurement result of the amount of axis displacement is shown in FIG. 16. The result was obtained by measuring a displacement angle of the a-plane and the m-plane of each prism-like light transmission plate 5 with respect to the c-axis by X-ray diffraction.

In the conventional method, two corundum pieces are joined with each other for aligned crystalline planes, ridges, axes, and axial angles. Therefore, if there was some sort of displacement with respect to the c-axis, the displacement angles would be the same in the two prism-like light transmission plates 5. For example, the numerical values of the a-plane (1) and the a-plane (2) of sample 1 are the same in FIG. 16.

However, in a synthetic corundum cell according to the present invention, it is only required that two corundum pieces be joined for aligned crystalline planes (a-plane and a-plane, or m-plane and m-plane), and it is unnecessary to align ridges, axes, and axial angles. Consequently, displacement angles of planes of the prism-like spacer plate 4 and the prism-like light transmission plate 5 parallel to the flow path with respect to the c-axis are not the same.

In a synthetic corundum cell according to the present invention, joint surfaces of a plurality of synthetic corundum cells are ground and superposed, and ends of the synthetic corundum cells are held in intimate contact with each other, and the synthetic corundum pieces are joined by being heated at a temperature equal to or lower than the melting point of synthetic corundum. It is possible to manufacture a synthetic corundum cell which has desired optical characteristics though it has boundaries, which has considerably high peeling strength though the synthetic corundum pieces may peel off from the boundaries, and which can be manufactured in a simple production process at a reduced cost and is suitable for practical applications.

If the flatness of the joint surfaces of the synthetic corundum pieces is in the range from ½ to ⅙ of the wavelength of red light, then the efficiency of the grinding process is increased, allowing a corundum cell to be manufactured more efficiently. If the synthetic corundum pieces are heated at a temperature ranging from 1100° C. to 1800° C., then the peeling strength of the synthetic corundum pieces is sufficient, and the temperature management is rendered easy.

What is claimed is:

1. A synthetic corundum cell comprising:
   a pair of light transmission plates comprising synthetic corundum;
   a pair of spacer plates comprising synthetic corundum, each of said spacer plates being positioned between said light transmission plates;
   wherein said light transmission plates and said spacer plates are heat-joined;
   wherein said light transmission plates and said spacer plates define a flow path for fluid in a central portion of said cell; and
   wherein said light transmission plates and said spacer plates are joined such that for at least one of said pairs of said light transmission plates and said spacer plates, c-axes thereof are disposed at an angle with respect to said flow path.

2. The synthetic corundum cell according to claim 1, wherein said light transmission plate and said spacer plates are arranged such that c-planes of corundum form front and back end surfaces of said synthetic corundum cell, and a-planes or m-planes of corundum form joint surface of said light transmission plates and said spacer plates.

* * * * *